United States Patent [19]

Kinbara

[11] 4,090,191
[45] May 16, 1978

[54] COUNTING CIRCUIT SYSTEM FOR TIME-TO-DIGITAL CONVERTER

[75] Inventor: Setsuro Kinbara, Mito, Japan

[73] Assignee: Japan Atomic Energy Research Institute, Tokyo, Japan

[21] Appl. No.: 711,979

[22] Filed: Aug. 5, 1976

[30] Foreign Application Priority Data

Aug. 8, 1975 Japan ................................. 50-96474

[51] Int. Cl.² ........................................... H03K 13/02
[52] U.S. Cl. ......................... 340/347 AD; 235/92 TF; 235/92 FQ; 328/41; 328/51; 340/347 M
[58] Field of Search ...................... 235/92 TF, 92 FQ; 340/347 M, 347 AD, 347 CC; 328/41, 51, 129, 130, 55; 307/293; 73/6; 58/23 R, 23 A

[56] References Cited
U.S. PATENT DOCUMENTS 3,634,854  1/1972  Anderson ..................... 340/347 AD Primary Examiner—Thomas J. Sloyan
Attorney, Agent, or Firm—Oblon, Fisher, Spivak, McClelland & Maier

[57] ABSTRACT

In an analog to digital converting circuit used in a pulse height analyzer or in a time to digital converting circuit used in a time analyzer, the first binary in a scaler for counting clock pulses is switched over to use the true state and the complementary state each of the reset circuit and the output circuit, alternately. By switching over the reset circuit and the output circuit, no substantial variation in counting the scaler is induced and any odd-even unbalance phenomena due to the binary constitution of the scaler is statistically equilibrated.

3 Claims, 7 Drawing Figures

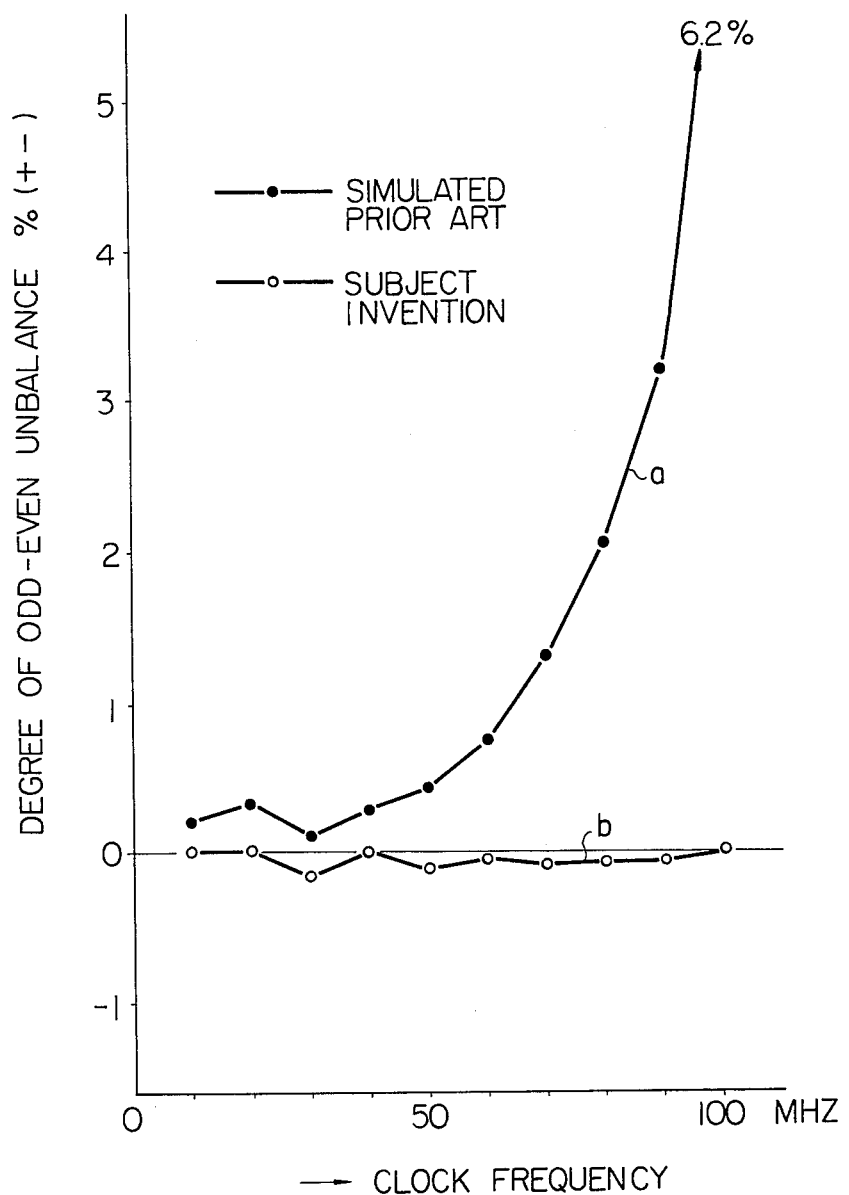

COUNTING CIRCUIT SYSTEM FOR TIME-TO-DIGITAL CONVERTER

BACKGROUND OF THE INVENTION

1. Field of the Invention

This invention relates to a converting circuit and, more particularly, to a time to digital converting circuit in which clock pulses are gated by time signals to make a pulse train which is proportional to the time signals and the pulse train is counted to provide digital information.

2. Description of the Prior Art

In the prior art, where clock pulses are gated by time signals having arbitrary pulse widths and, then, the gated clock pulse train is counted by a scaler, a counted value or a digital value which is proportional to the time signals is obtained. In the process of the gating operation and the counting operation, the phase of the clock pulse at which the gate is finally closed in the gating operation is not necessarily kept definite with reference to the gating operation so that the wave form of the last clock pulse is liable to assume an uncertain form. The uncertain form of a clock pulse affects the operation in a first stage binary in the counting operation and it is considered to induce an odd-even unbalance phenomena of the binary circuit. The odd-even unbalance phenomena of the binary circuit is referred to, in this invention, as a phenomena in which variety in counting of clock pulses appears every other channel due to the odd-even unbalance of a binary.

The odd-even unbalance phenomena in the counting result is considered to originate from the fact that the unbalance characteristics of triggers meet with uncertain pulses generated by gate operations under a condition (i) the first stage binary itself has unbalance characteristics against the trigger sensitivity toward the odd direction as well as the even direction, a condition (ii) unbalance is induced in the odd-even characteristics of a trigger according to the unbalance in the load of the binary and a condition (iii) the output voltage or current affects trigger pulses due to the binary operation and the trigger pulses assume distortions in the wave-form in every other pulse due to induction from a binary so that odd-even characteristics are unbalanced.

In order to resolve the odd-even unbalance phenomena, in the prior art, as a first countermove, the counting speed of a scaler is reduced in the operation, as a second countermove, the gated clock pulses are forced to pass through a shaping circuit in order not to ultimately turn the clock pulse to uncertain pulse and, as a third countermove, an arrangement in which the binary operation does not affect trigger pulses and wires are shielded and grounded completely, is provided.

Since the higher the counting speed, the larger the odd-even unbalance phenomena in general, reducing the counting speed is appreciated as effective and, therefore, the first countermove is recognized to be advantageous. However, even though effectiveness in the second countermove and the third countermove can be expected to some extent, a full settlement to the odd-even unbalance phenomena is almost difficult. Thus, in many cases, the performance of the counting circuit is restricted due to the reduction of the counting speed of the binary to $\frac{1}{2}$ to $\frac{1}{3}$ of the maximum counting speed of the binary itself depending on the first countermove.

SUMMARY OF THE INVENTION

The fundamental conception of this invention is briefly explained as follows:

In an analog to digital converter, referred to as ADC hereinafter, used in a pulse height analyzer or in a time to digital converter, referred to as TDC hereinafter, used in a time analyzer, a phenomena is noted in which variety in counting of clock pulses appears every other channel according to the odd-even unbalance of binary due to the fact that the scaler which counts the clock pulses is constituted by binary circuits.

This phenomena appears in almost all the ADC and the TDC to express some 0.5 to 1.0% unbalance. This affects adversely the differential linearity which is demanded to be 0.1% to 0.2% equilibrium and this is a remarkable defect. It is noted that using the first stage binary is switched alternately over in order to resolve the odd-even unbalance phenomena and this can improve the unbalance.

The true state and the complementary state each of the reset circuit and the output circuit of the first stage binary of an ADC or a TDC are switched over to be used alternately. By switching simultaneously over the reset circuit and the output circuit, no substantial variation in counting of the scaler is induced and any odd-even unbalance phenomena is statistically equilibrated so that the odd-even unbalance phenomena in the output is not induced.

In using an ADC as a pulse height analyzer or a TDC as a time analyzer, resultants in measurement are summarized to provide a histogram which gives a combined resultant and, therefore, appearance of the odd-even unbalance phenomena results in a heavy defect in measurement accuracy.

Therefore, an object of this invention is to provide a high speed time to digital converting circuit with high accuracy in which the binary of a scaler constituting a converting circuit by using an analog to digital converter or a time to digital converter is processed by circuits and the probability where the resultant of binary counting represents an even number or an odd number is equilibrated so that so-called odd-even unbalance phenomena does not statistically appear.

BRIEF DESCRIPTION OF THE DRAWING

FIG. 7 shows experimental data of the circuit given in FIG. 6 and that of prior art.

DESCRIPTION OF THE PREFERRED EMBODIMENT

Figure 1:
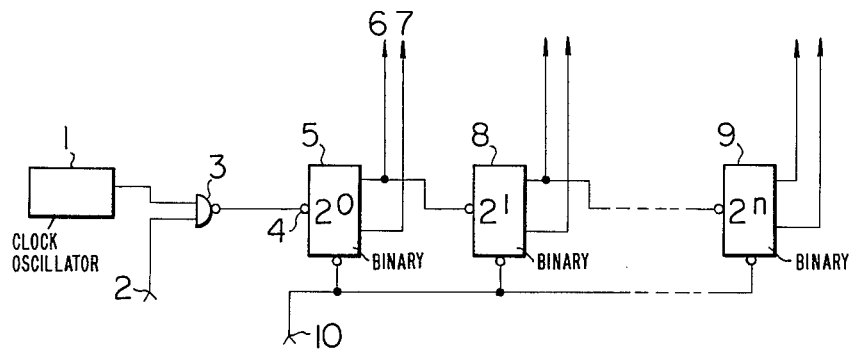
FIG. 1 shows a fundamental construction of a time to digital converting circuit of prior art.
Figure 2:
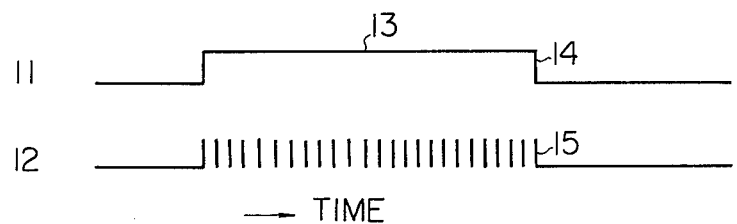
FIG. 2 shows wave forms explaining the operation of the time to digital converting circuit shown in FIG. 1.

In FIGS. 1 and 2 which show an example of a TDC of prior art, a clock oscillator 1 is usually oscillating to provide clock pulses and time signals are applied to a gate 3 in the form of a pulse width. The clock pulses pass through the gate 3 during an interval 13 of the time signals to trigger a first stage binary 5 of a scaler. The constitution of a second stage binary 8 and the succeeding stage binary in a binary code system differs from the constitution of those in a decimal code system but the first stage binary is, in general, independently dealt with from the second stage binary and the succeeding ones. Therefore, the first stage binary in the two code systemes can be treated in the same logic.

The time 14 when the interval 13 of the time signals terminates appears at an arbitrary phase which is independent from the phase of the clock pulses and, therefore, a last clock pulse 15 is liable to assume an incomplete pulse wave form. When an incomplete pulse wave form is obtained, triggering of the first stage binary 5 becomes incomplete due to some unbalance of the binary as stated above and the probability the first stage binary 5 halts at an even number differs from the probability the first stage binary 5 halts at an odd number to induce so-called the odd-even unbalance phenomena.

Figure 3:
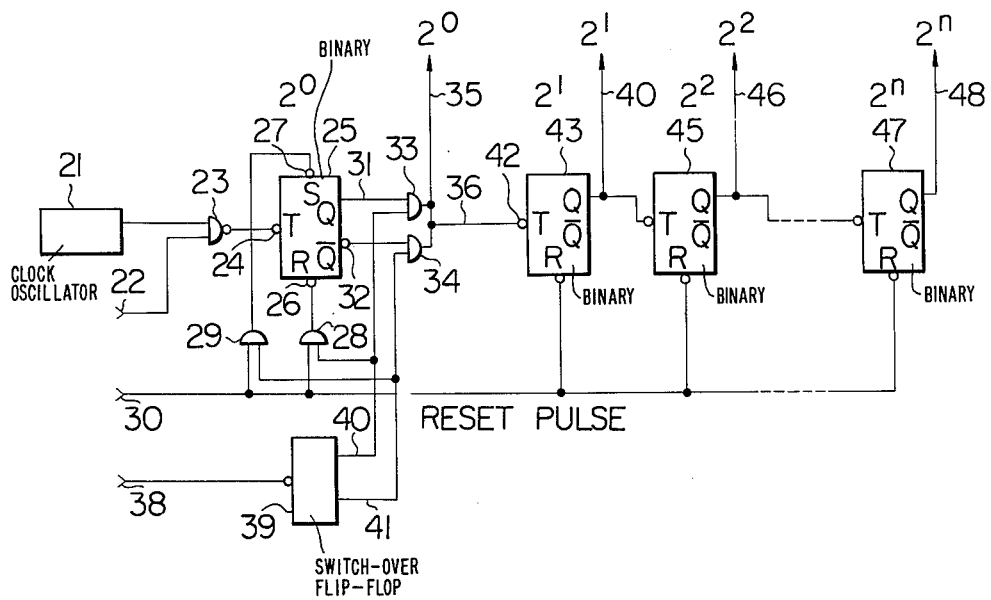
FIG. 3 shows a fundamental construction of a time to digital converting circuit of this invention.
Figure 4:
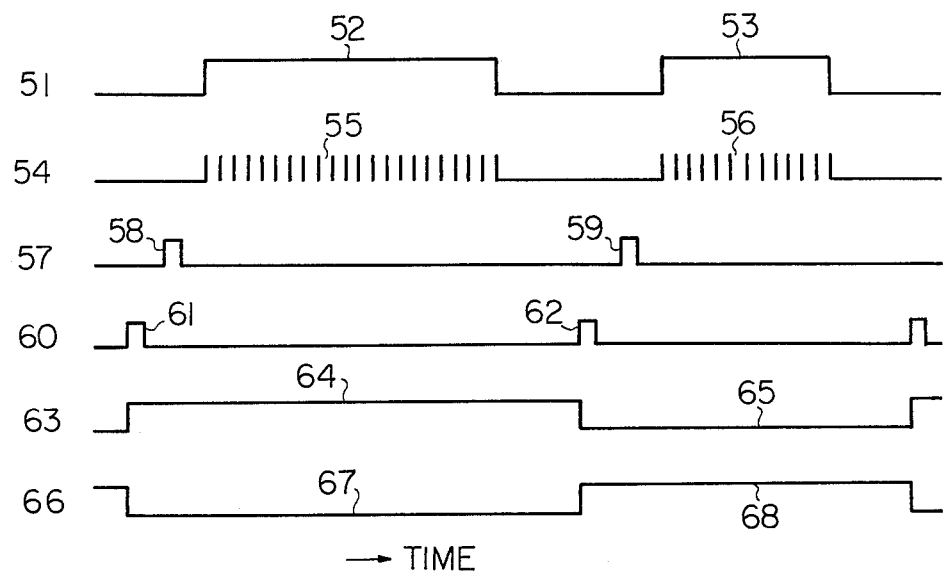
FIG. 4 shows wave forms explaining the operation of the time to digital converting circuit shown in FIG. 3.

In FIGS. 3 and 4 which show a fundamental conception of a TDC of this invention, a clock oscillator 21 is connected to a first stage binary 25 through a gate 23 and reset pulses at a terminal 30 are applied to the first stage binary 25 through reset gates 28 and 29 and to a second stage binary 43, a third stage binary 45 and a succeeding stage binary 47, these binaries constituting a scaler. Switching over signals at terminal 38 are connected to a switch-over flip-flop 39 and the outputs on terminals 40 and 41 are applied to reset gates 28 and 29 as well as output gates 33 and 34 in the output circuit of the first stage binary 25 in parallel to provide a wired OR circuit. Time signals on terminals 22 are applied to the gate 23 with a predetermined pulse width.

The operation of the TDC shown in FIG. 3 is explained with reference to the wave forms shown in FIG. 4. The time signals on the terminal 22 are applied as a wave form 51, the reset signals on the terminal 30 are applied as a wave form 57 and the switch over signals on the terminal 38 are applied as a wave form 60. When a time signal of a wave form 52 in the wave form 51 is applied the clock pulses of a wave form 55 is obtained by means of the gate 23 and is counted by the first stage binary 25. During this cycling, when the switch-over flip-flop 39 triggered to the set side by means of the switch over signals of a wave form 61 in the wave form 60, an effective output of a wave form 64 is obtained on the terminal 40 as a true state and an ineffective output of a wave form 67 is obtained on the terminal 41 as a complementary state. Thus, the reset gate 28 and the output gate 33 both connected to the terminal 40 are opened and the reset gate 29 and the output gate 34 both connected to the terminal 41 are closed. Under this condition, the first stage binary 25 is reset by a reset terminal 26 to provide the output as the true state on a terminal 31 and the second stage binary 43, the third stage binary 45 and the succeeding binary 47 are reset in the same reset operation and provide an output.

When the switch-over flip-flop 39 is switched over by means of the switch over signals of a wave form 62 in the wave form 60 and the converting cycling is shifted to the succeeding one to apply a time signal of a wave form 53 in the wave form 51, the open-close conditions of the reset gate and the output gate are reversed. Thus, the reset gate 29 and the output gate 34 are opened and the first stage binary 25 is reset by a set terminal 27 to provide the output as the complementary state on a terminal 32. As the output from the reset gate and the output gate are both reversed, the apparent relationship of the first stage binary 25 is the same as that in the normal condition as seeing from the whole scaler system and no problem in counting occurs.

However, as to the output of the first stage binary itself, the relationship between the true state and the complementary state is dealt fully contrary in these two cycling and the odd-even unbalance phenomena is also reversed at an output terminal 35. As stated above, the odd-even relationship of the first stage binary is used by switching the two states over at every conversion cycle with maintaining the apparent relationship constant and, therefore, the odd-even relationship appearing in the output is equilibrated to eliminate statistically the odd-even unbalance phenomena.

Figure 5:
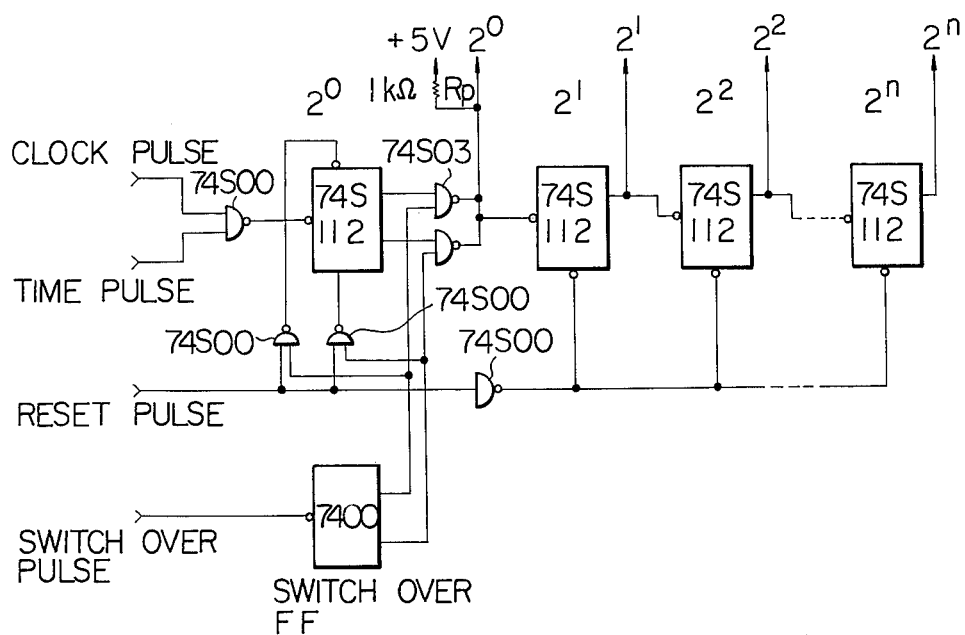
FIG. 5 shows an embodiment of a time to digital converting circuit of this invention.

In FIG. 5, an embodiment is shown in which an integrated circuit (IC) of Schottkey Type Transistor-Transistor-Logic (TTL) is used. The first stage scaler of the TDC in the TTL-IC operates with a 100 MHz clock pulse frequency. In the TTL-IC, the scaler is of 74S 112 type IC, the reset gate is of 74S00 type IC and the output gate is of 74S03 type IC (open collector type) with a wired OR connection.

In a TDC of prior art using no odd-even switch over, the odd-even unbalance phenomena appears to be 2% to 6% with a 100 MHz clock pulse accompanying a variation due to the difference in the IC performance itself, its arrangement or its connection whereas in the embodiment shown in FIG. 5 the odd-even unbalance phenomena appears to be 0.1% or less.

Particularly, the arrangement of the reset gate and the output gate is reversed between FIGS. 3 and 5. This is done due to the fact that a gate of NOR function is used as the output gate and, therefore, the polarity or the odd-even relationship between the true state and the complementary state is reversed at the gate.

Figure 6:
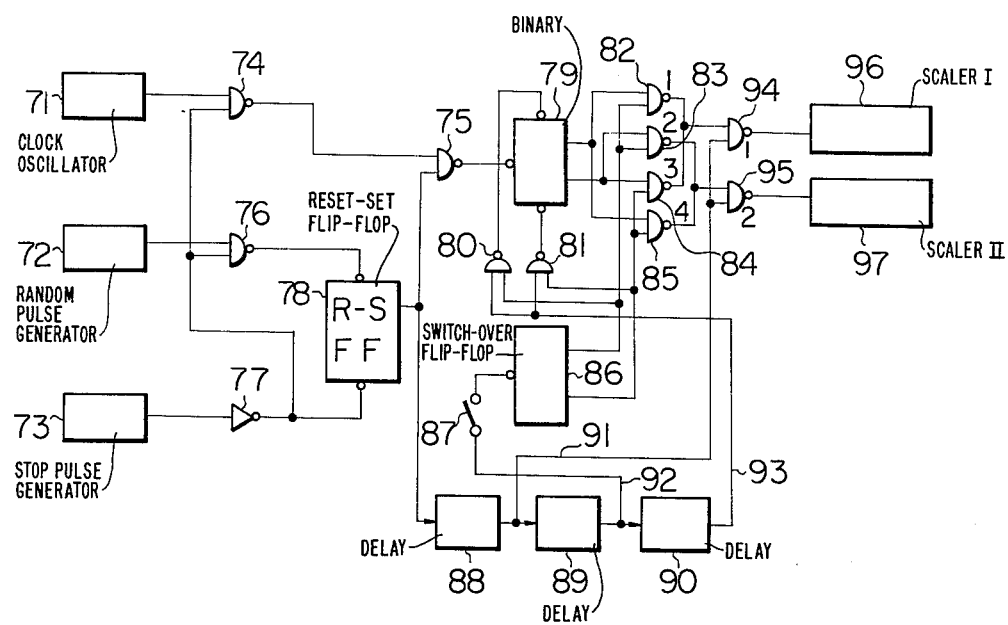
FIG. 6 shows an experimental circuit where the effect of this invention is confirmed.

The experimental circuit shown in FIG. 6 is used to confirm the effect of the process of this invention in which the odd-even unbalance phenomena is balanced substantially by means of equilibration. In the circuit, the first stage binary is only dealt with for test. A binary 79 to be tested is triggered by clock pulses from a clock oscillator 71. A reset-set flip-flop (R-S FF) 78 is set or reset by a random pulse generator 72 and a stop pulse generator 73 (periodic pulse) to provide time signals. The clock pulses are controled at a control gate 75 by the time signals from the R-S FF during the period the R-S FF is set. The binary 79 is triggered by the output of the control gate 75 and the period of the two pulse generators are so selected by means of the random pulse generator that no beat phenomena is induced by a testing pulser.

When the R-S FF is closed a delay 1 which is denoted as 88, a delay 2 which is denoted as 89 and a delay 3 which is denoted as 90 operate sequentially to provide timing pulses, an odd-even information of the binary 79 which is now under testing is derived from output count gates 94 and 95 by the delay 88, a switch over flip-flop 86 is reversed by the delay 89 and the binary 79 is reset by the delay 90.

The outputs of the output count gates 94 and 95 are connected to a scaler 1 which is denoted as 96 and a scaler 2 which is denoted as 97, respectively, to count the odd-even information of every cycle. A number of counting exceeding $10^6$ times is effected in order to neglect any counting error and the odd-even balance is measured.

As a simulation of prior art circuit, a mode switch 87 connecting the output of the delay 89 to the switch over FF 86 is opened to stop the function of the switch over FF and the switch over gate of the binary 79 is fixed at one side to measure by counting the odd-even number of the binary 79 by means of the scalers 96 and 97.

FIG. 7 shows the resultant of measurement of the odd-even unbalance phenomena used in the circuit shown in FIG. 6. Curve (a) represents the degree of odd-even unbalance in the simulated prior art circuit by opening of the mode switch 87. The abscissa represents the frequency of clock pulses and the ordinate represents the degree of unbalance in %. The curve (a) shows that the higher the frequency of clock pulses the larger the degree of unbalance and the frequency should be limited to an order of 50 MHz in order to use the TDC with an unbalance not exceeding 0.5%. The curve (b) shows the degree of unbalance obtained from measurement in the circuit shown in FIG. 6 with the mode switch 87 closed to follow the process of the switch over of this invention and show that the degree of balance is maintained less than 0.17% almost independent of the frequency of clock pulses in a range from 10 MHz to 100 MHz.

An example of the degree of unbalance of prior art is shown in the curve (a) in FIG. 7 but the degree varies according to the kind of the IC, the wiring and the degree of balance of the load to show various characteristics based on the variety in the conditions. On the contrary, no substantial variation in the degree of unbalance is recognized against the variety in the conditions to assure a remarkable improvement in subject invention.

As can be understood from the experimental data stated above, the TDC of this invention shows effective improvement of the odd-even unbalance phenomena and a good degree of balance can be provided without limiting the counting speed of the scaler so that a remarkable high accuracy is effectively increased in the TDC of this invention. Thus, in an ADC where the principle of the TDC stated above is utilized, roads to expedite high accuracy and high speed are opened.

In the description above, a process is explained where a switch over circuit is applied to the first stage binary of a scaler to switch over alternately the binary at each converting operation. However, when the period the information of an object to be measured comes in is extremely periodical or when the analog value of time signal or input signal in an ADC vaires periodically, mere alternate switch over is liable to induce a beat and to induce a problem. In these circumstances, it is necessary to switch over at a period which has no relation to the converting cycle, such as a period of a random pulser, in order to eliminate the beat phenomena, with no actual switch over during converting operation. Moreover, the random switch over process may be applied to a general measurement as it is.

In the description above, only the first stage binary of a scaler is switched over. However, when the unbalance phenomena in the binary is quite remarkable, for instance the balance in the binary of a transistor circuit is not good, the odd-even unbalance phenomena may appear with reference to the second stage binary as well as to the first stage binary. Under this cricumstance, the gate as given in FIG. 5 can be applied to the second stage binary to improve the odd-even unbalance phenomena in the second stage binary. The conception similar to that explained above can also be applied to any third stage binary and fourth stage binary when any unbalance phenomena appears in the stages.

What is claimed is:

1. In a time to digital converting circuit providing digital information by gating clock pulses of constant cycle by time signals with information in its pulse width and by counting the gated clock pulses by a scaler; a combination of; two AND gates respectively provided in a reset circuit and an output circuit of a first stage binary of said scaler, the output of the first AND gate of said reset circuit being connected to the reset terminal of said first stage binary, the output of the second AND gate of said reset circuit being connected to the set terminal of said first stage binary, the input to the first AND gate of said output circuit being connected to the true value output terminal of said first stage binary, the input to the second AND gate of said output circuit being connected to the complementary value output terminal of said first stage binary, the outputs of the two AND gates in said output circuit being combined with OR function to be a carry signal to succeeding binary and an output signal to outside; a first switch over signal circuit provided to be connected to the first AND gate of said reset circuit and to the first AND gate of said output circuit; and a second switch over signal circuit provided to be connected to the second AND gate of said reset circuit and to the second AND gate of said output circuit, the switch over signals of said two switch over signal circuits being related to act as a true and a complementary at the output of a switch over flip-flop.

2. A time to digital converting circuit specified in claim 1, wherein switch over said binary is effected at a period which has no relation to converting cycle.

3. A time to digital converting circuit specified in claim 2, wherein switch over said binary is applied to the second stage and/or the third stage.

* * * * *